(12) United States Patent
Lee (10) Patent No.: US 6,956,769 B2
(45) Date of Patent: Oct. 18, 2005

(54) SEMICONDUCTOR MEMORY DEVICE WITH A FLEXIBLE REDUNDANCY SCHEME

(75) Inventor: Sung-Soo Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 408 days.

(21) Appl. No.: 10/373,410

(22) Filed: Feb. 24, 2003

(65) Prior Publication Data

US 2003/0167372 A1 Sep. 4, 2003

(30) Foreign Application Priority Data

Mar. 4, 2002 (KR) ......................................... 2002-11274

(51) Int. Cl.[7] .......................... G11C 16/04; G11C 16/06
(52) U.S. Cl. ............................ 365/185.09; 365/185.11; 365/185.17
(58) Field of Search ....................... 365/185.09, 185.11, 365/185.17

(56) References Cited

U.S. PATENT DOCUMENTS

| 6,424,588 B2 * | 7/2002 | Nakamura et al. | 365/185.11 |
| 6,525,952 B2 * | 2/2003 | Araki et al. | 365/185.11 |
| 6,542,406 B2 * | 4/2003 | Byeon et al. | 365/185.09 |
| 6,754,115 B2 * | 6/2004 | Sugita | 365/185.11 |
| 6,778,443 B2 * | 8/2004 | Shiga et al. | 365/185.11 |
| 6,788,609 B2 * | 9/2004 | Yamagami et al. | 365/185.11 |
| 6,891,753 B2 * | 5/2005 | Cernea | 365/185.11 |

FOREIGN PATENT DOCUMENTS

| KR | 1996-0008851 | 3/1996 |
| KR | 1998-026248 | 7/1998 |

OTHER PUBLICATIONS

English language abstract of Korean Publication No. 1998–026248.
English language abstract of Korean Publication No. 1996–0008851.

* cited by examiner

*Primary Examiner*—Trong Phan
(74) *Attorney, Agent, or Firm*—Marger Johnson & McCollom, P.C.

(57) ABSTRACT

A semiconductor memory device including an array with a first memory cell block having redundancy blocks and a second memory cell block having normal blocks. A redundancy block in the first memory cell block is substituted for a defective normal block in the second memory cell block. The substitution is performed by a block selection circuit. When substitution is required, the block selection circuit selects from among the first memory cell blocks in inverse order, beginning with the first memory cell block having the highest address. First memory cell blocks that are not substituted for defective cell blocks are used as normal memory cell blocks by the block selection circuit.

17 Claims, 7 Drawing Sheets

Fig. 1

(Prior Art)

SEMICONDUCTOR MEMORY DEVICE WITH A FLEXIBLE REDUNDANCY SCHEME

CROSS REFERENCE TO RELATED APPLICATIONS

This application claims priority under 35 USC § 119 to an application entitled "SEMICONDUCTOR MEMORY DEVICE WITH FLEXIBLE REDUNDANCY SCHEME" filed in the Korean Industrial Property Office on Mar. 4, 2002 and assigned No. 2002-11274, the contents of which are hereby incorporated by reference in their entirety for all purposes.

BACKGROUND OF THE INVENTION

1. Technical Field of The Invention

This disclosure relates to semiconductor memory devices and more particularly, to non-volatile semiconductor memory devices with flexible redundancy schemes.

2. Description of the Related Art

As semiconductor memory devices follow the trend of increased integration density, chip sizes continue to shrink. Reduced product yields arise because of the increasing complexity of manufacturing processes. The reduced product yield of semiconductor devices is mostly responsible for defects of memory cells.

The redundancy technique, where defective cells are substituted with redundant cells virtually in situ, is a widely adopted way to enhance the product yield despite memory cell defects. Some kinds of memory cells are normally usable even with several defects in their cell arrays, referring to their specifications (i.e., data books) defining the permissible number of defective memory cells therein. For example, NAND flash memory devices, unlike DRAMs or SRAMs, are still capable of functioning even though there are defective memory cells in part of the array.

Figure 1:
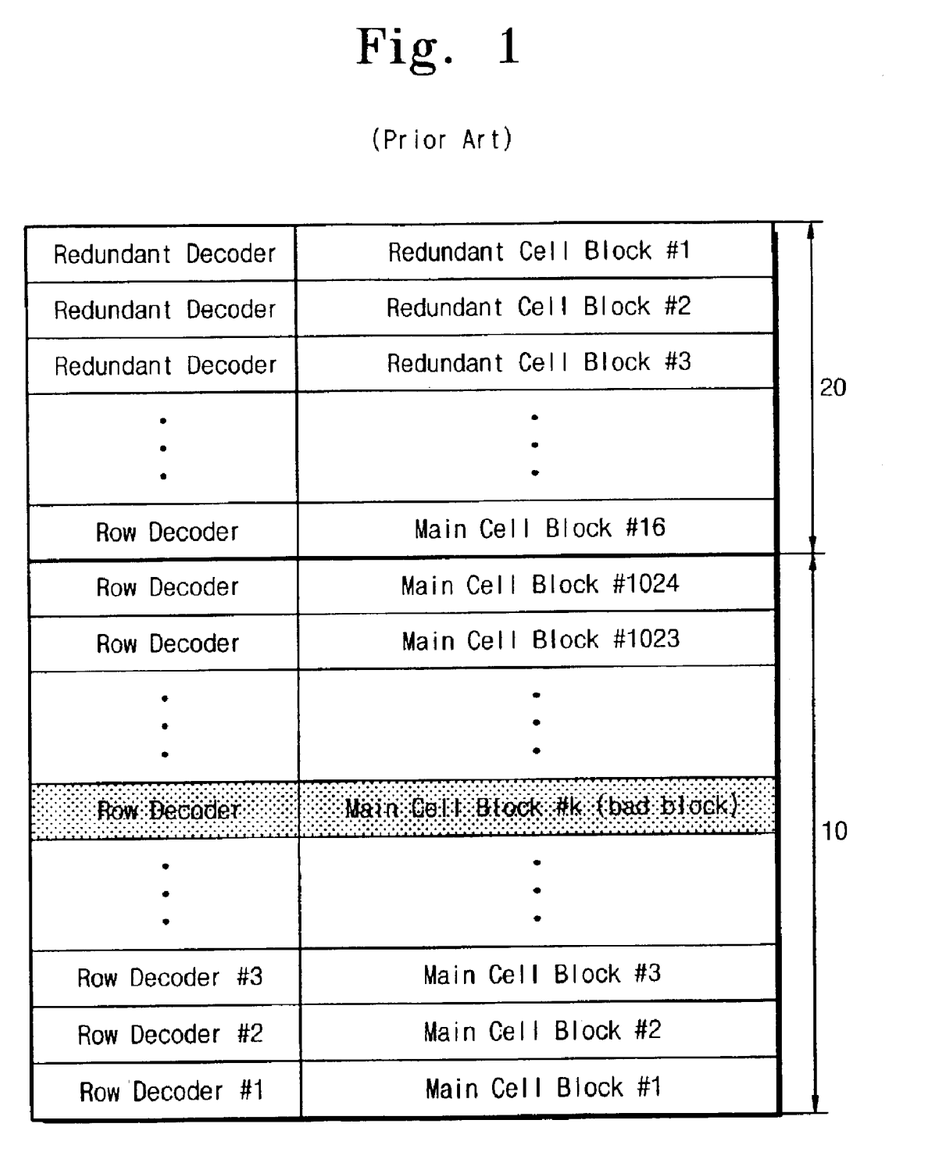
FIG. 1 is a general block diagram illustrating the structure of a conventional non-volatile memory device array.

FIG. 1 shows a structure of a typical semiconductor memory cell array having redundant cell blocks. Referring to FIG. 1, a memory cell array is divided into a main cell area 10 and a redundant cell area 20. The main cell area 10 is composed of 1,024 main memory cell blocks and the redundant cell area 20 is composed of 16 redundant memory cell blocks. The main and redundant memory cell blocks both have the same structure.

The main cell blocks of the main cell area 10 correspond to adjacent row decoders while the redundant cell blocks of the redundant cell area 20 correspond to adjacent redundant decoders, where the decoders control rows of their corresponding cell blocks.

Even in a NAND flash memory device that is operable in a condition with defective cell blocks or bad blocks within a specified number, it may occur that the number of bad blocks is greater than the number of redundant cell blocks embedded therein. If a K'th main cell block is detected as a new bad block after all redundant cell blocks have already been exhausted by substitution for other bad blocks, the position of the new bad block must be designated in order to operate the over-failed NAND flash memory device in a normal manner, without disturbance while addressing the cell blocks.

SUMMARY OF THE INVENTION

Embodiments of the invention provide semiconductor memory devices with an automatic bad block mapping function. Automatically mapping the bad blocks of a NAND flash memory device makes it possible to arrange address system operable with information of bad blocks.

In accordance with other embodiments of the invention, a semiconductor memory device is provided that includes first memory cell blocks and second memory cell blocks that store data information; a decoding signal generation circuit that generates decoding signals in order to select the first and second memory cell blocks after decoding row address; a first row decoder circuit that selects the first memory cell block in response to the decoding signals and redundancy signals; a second row decoder circuit that selects the second memory cell blocks in response to the decoding signals; an address store circuit that generates the redundancy signals when the row address indicates that the second memory cell blocks have defective memory cell blocks; and a disabling circuit that inactivates the decoding signal generation circuit in response to the activation of the redundancy signals.

In accordance with other embodiments of the invention, a NAND flash memory device includes a memory cell array having first memory cell blocks and second memory cell blocks; a decoding signal generation circuit for generating decoding signals to select the first and second memory cell block after decoding row address; a first row decoder for selecting one of the first memory cell blocks in response to the decoding signals and the redundancy signals; a second row decoder for selecting one of the second memory cell blocks in response to the decoding signals; an address store circuit for activating one of the redundancy signals when the row address indicates that the first memory cell block is defective memory cell blocks; and a diasbing circuit for inactivating the decoding signal generation circuit in response to the activation of the redundancy signals.

BRIEF DESCRIPTION OF THE DRAWINGS

The forgoing and other objects, features and advantages of the invention will be apparent from the more particular description of an embodiment of the invention with reference to the accompanying drawings.

DETAILED DESCRIPTION OF THE INVENTION

In the following detailed description, several specific details are set forth in order to provide a thorough understanding of the invention. It will be obvious, however, to one skilled in the art that the invention may be practiced without these specific details. Now, practical embodiments of the invention will be explained in conjunction with the drawings. This invention will be described with reference to a FLASH memory device having a NAND-type cell arrangement. However, the invention may also be applied to other memory devices. To accomplish the described objects, the invention provides a semiconductor memory device that includes a number of memory cell blocks, each having memory cell array. The memory cell blocks include first memory cell blocks and second memory cell blocks in which the first memory cell block is assigned to substitute for at least one defective memory cell block found in the second memory cell blocks.

Figure 2:
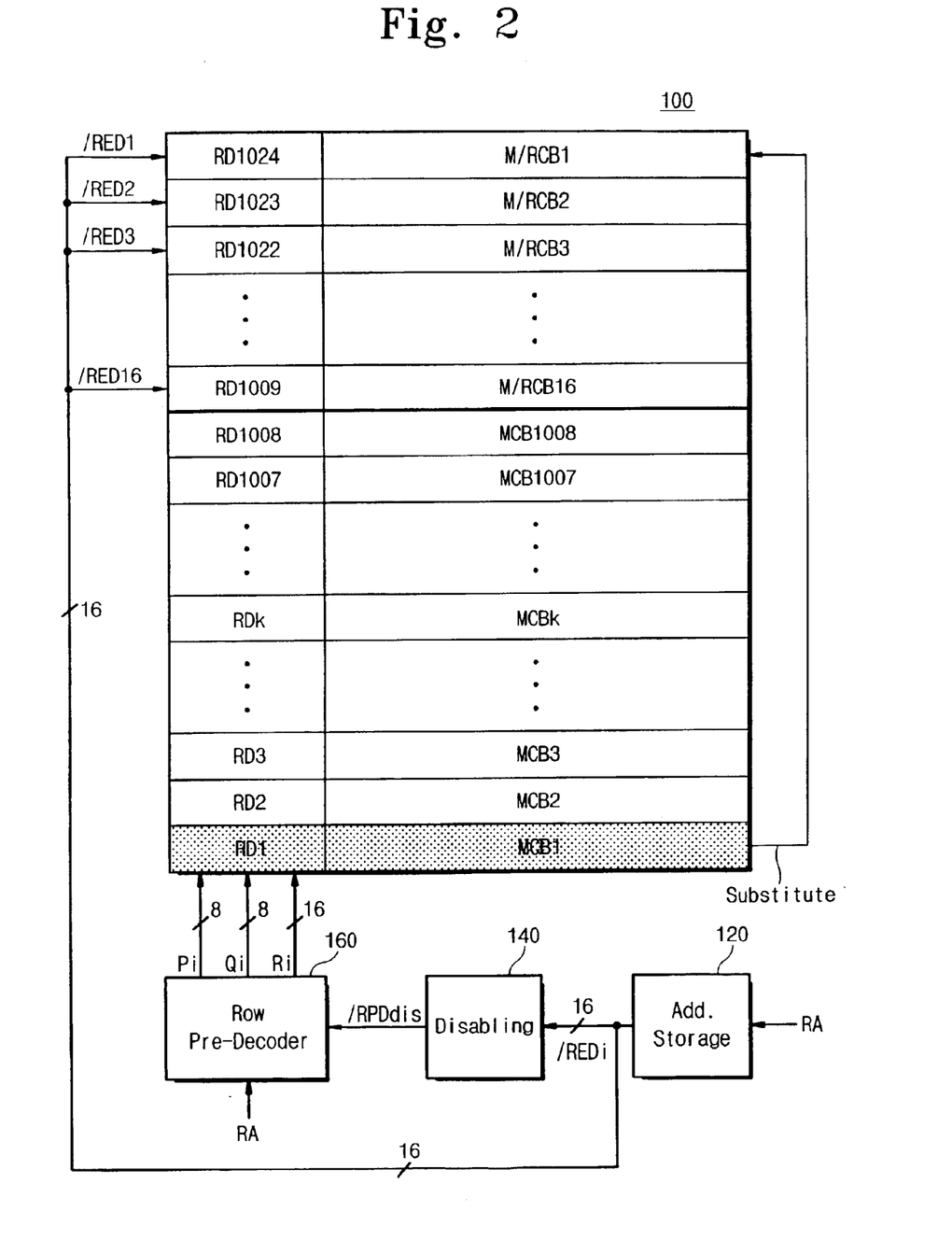
FIG. 2 is a block diagram of a non-volatile memory device according to an embodiment of the invention.
Figure 3:
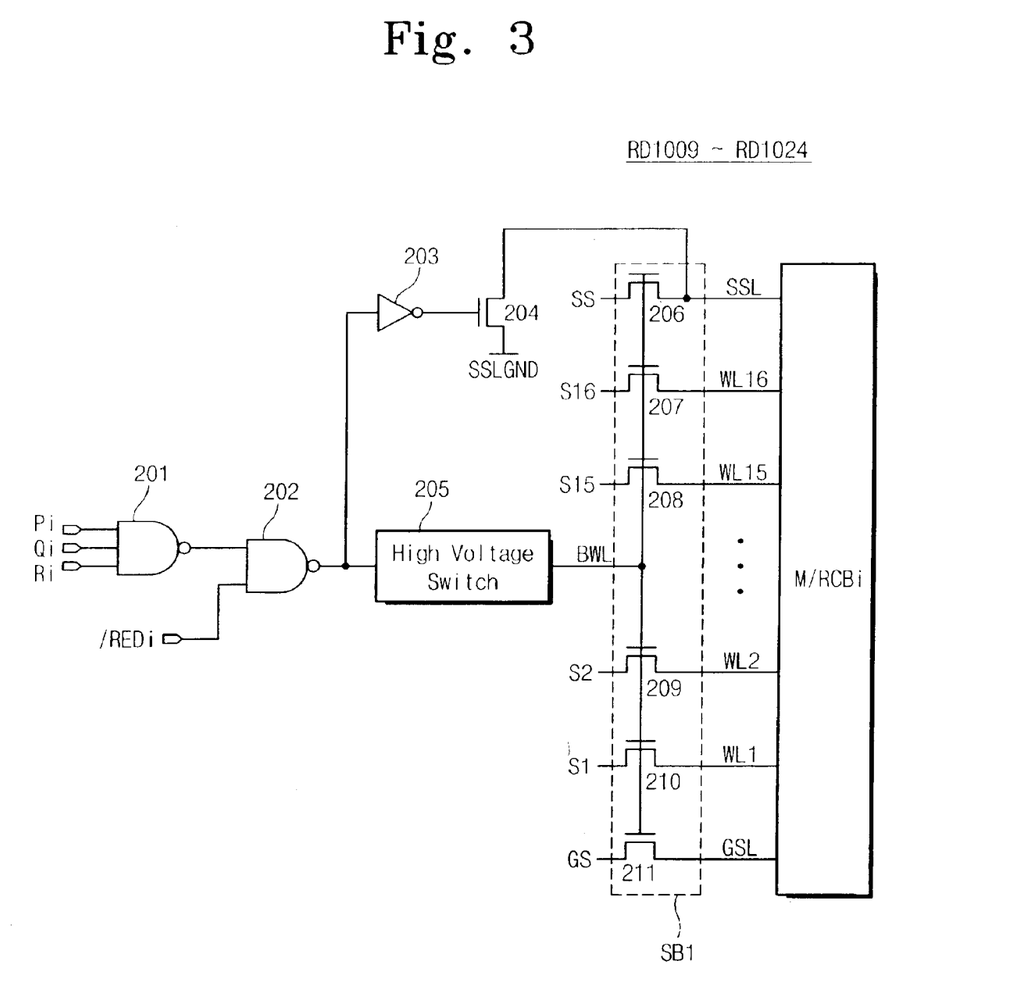
FIG. 3 further illustrates the row decoder circuit from the redundant memory block shown in FIG. 2.
Figure 4:
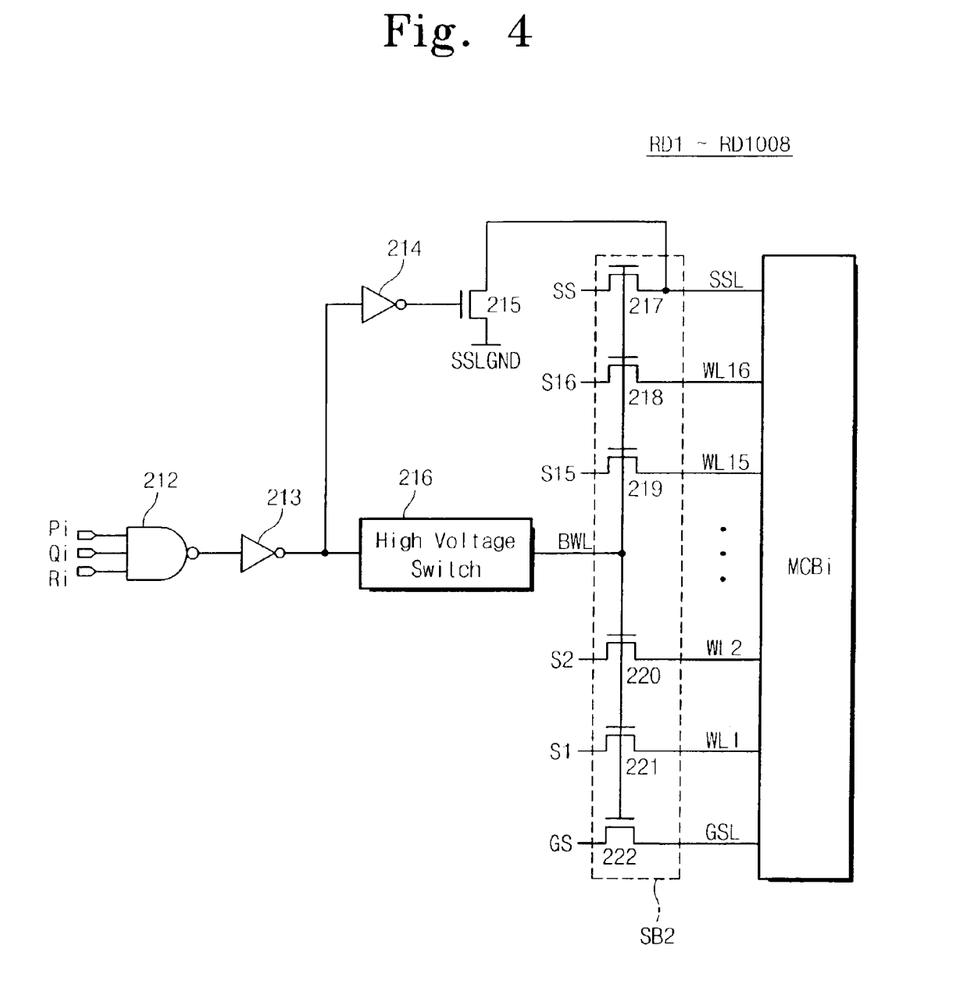
FIG. 4 further illustrates the row decoder circuit for the main memory block shown in FIG. 2.

FIG. 2 is a block diagram of a non-volatile memory device according to an embodiment of the invention. FIG. 3 is a row decoder corresponding to memory cell blocks M/RCB1–M/RCB16 of FIG. 2. FIG. 4 is a row decoder corresponding to memory cell blocks MCB1–MCB1008 of FIG. 2. In FIG. 2, the non-volatile semiconductor memory device 100 includes a memory cell array for storing data information in which the memory cell array is composed of a number of memory cell blocks. Several blocks from the number of memory cell blocks do not store additional bad block information and are defined as main cell blocks or redundant cell blocks. In other words, the non-volatile semiconductor memory device according to embodiments of the invention has an automatic mapping function for bad blocks, so that there is no need to conduct additional read operations for address mapping. This will be explained in greater detail later in the disclosure.

As shown in FIG. 2, memory cell blocks MCB1–MCB1008 are used as main cell blocks, and memory cell blocks M/RCB1–M/RCB16 are used as redundant cell blocks. The memory cell blocks MCB1–MCB1008, each corresponding to a redundancy signal /RED1–/RED16, can be used as normal cell blocks or redundant cell blocks that are substituted for defective memory cell blocks. The redundancy signals /RED1–/RED16 corresponding to the cell blocks are enabled in inverse order from the highest address. For example, if the first memory cell block MCB1 is a bad block, its corresponding redundancy signal /RED1 is enabled to substitute the memory cell block M/RCB1 for the bad block MCB1. If another cell block (e.g., MCBk) is indicated as a bad block, its corresponding redundancy signal /RED2 is enabled to substitute the memory cell block M/RCB2 for the bad block MCBk.

According to embodiments of the invention, the number of memory cell blocks M/RCB1–M/RCB16 in use as redundant cell blocks is defined by the redundancy capability of the memory device and the number of permissible defective memory cell blocks. Therefore, the memory cell blocks M/RCB1–M/RCB16 are not always fixed as redundant cell blocks. They may be usable as normal cell blocks if there is no other defective or bad block to replace.

The memory cell blocks M/RCB1–M/RCB16 are each connected to row decoders with the same structure as one another. Each row decoder includes, as shown in FIG. 3, NAND gates 201 and 202, an inverter 203, NMOS transistors 204, 206–211, and a high voltage switch 205. Not shown in FIG. 3 are the NMOS transistors corresponding to the selection signals S14–S3. Decoding signals Pi, Qi, Ri are applied to a NAND gate 201, and then the output of the NAND gate 201 and the redundant signal /REDi are applied to NAND gate 202. The high voltage switch 205 transfers several types of voltage, which are required in several operation modes such as programming, reading, etc, to a block word line BWL responsive to the output of NAND gate 202. A switch block SB1 including NMOS transistors 206–211 is connected to the block word line BWL and transfers selection signals SS, S16–S1, and GS to a string selection line SSL, word lines WL16–WL1, and a ground selection line GSL, respectively. An NMOS transistor 204 is connected between string selection line SSL and ground node SSLGND that is controlled by the output signal of the NAND gate 202. The output signal of the NAND gate 202 is applied to the gate of the NMOS transistor 204 through an inverter 203. If the corresponding memory cell block is not selected, the string selection transistor goes to ground level SSLGND through the NMOS transistor 204.

In operation, when all the decoding signals Pi,Qi,Ri become high level, and the redundancy signal /REDi becomes high level, the high voltage switch 205 receives a high voltage from a high voltage generating circuit (not shown) and provides the high voltage to the block word line BWL in response to the output signal of NAND gate 201. A high voltage is needed for several modes such as programming, reading, etc. If the redundancy signal /REDi is low level, the output signal of the NAND gate 202 is at a high level irrespective of the output signal of the NAND gate 201. As a result, the high voltage switch 205 is activated, and therefore the memory cell block M/RCBi will be selected instead of the defective memory cell block.

As illustrated in FIG. 4, the memory cell blocks MCB1–MCB1008 of FIG. 2 are each connected to a row decoder RD1–RD1008. Each row decoder includes a NAND gate 212, inverters 213 and 214, NMOS transistors 215 and 217–222, and a high voltage switch 216. Not shown in FIG. 4 are the NMOS transistors corresponding to the selection signals S14–S3. The inverter 213 may alternatively be implemented as a NAND gate, similar to NAND gate 212, with two input terminals connected to an output of the NAND gate 212 and a third input terminal connected to a power supply voltage. The NAND gate 212 receives the decoding signals Pi, Qi, Ri and then generates an output signal. The output signal of the NAND gate 212 is transferred to the high voltage switch 205 through the inverter 213. The high voltage switch 216 transfers a required voltage for each operation mode to the block word line BWL in response to the output of the inverter 213. The switch block SB2 including NMOS transistors 217–222 is connected to the block word line BWL and then provides selection signals SS, S16–S1, and GS to string selection line SSL, word lines WL16–WL1, and a ground selection line GSL, respectively. An NMOS transistor 215 is connected between the string selection line SSL and the string selection line ground node SSLGND, controlled by an output signal from the inverter 214. When a memory cell block corresponding to the row decoder is not selected, NMOS transistor 215 sets the string selection line SSL to the ground voltage.

Returning to FIG. 2, the non-volatile semiconductor memory device 100 according to embodiments of the invention have an address storage circuit 120, a disabling circuit 140 and a row pre-decoder 160. The address storage circuit 120 stores row addresses relating to defective memory cell blocks by means of laser fuses, electric fuses, or EEPROM cells. The address storage circuit 120 receives a row address RA as an input and generates the redundancy signals /RED16–/RED1. For example, if a current row address RA indicates a defective memory cell block, the redundancy signal corresponding to the current row address is activated.

An example of the address storage circuit 120 is disclosed in Korean publication number 1996-0030255, which is hereby incorporated as a reference. The disabling circuit 140 generates a disabling signal /RPDdis in response to the redundancy signals /RED16–/RED1 generated from the address storage circuit 120. For example, as one of the redundancy signals /RED[16:1] is activated, the disabling circuit 140 activates the disabling signal /RPDdis.

The row pre-decoder 160 decodes the row address RA to generate the decoded signals Pi, Qi, Ri. The decoded signals Pi, Qi, Ri are provided to the row decoders RD1–RD1024.

When the disabling signal /RPDdis is activated, all of the decoding signals Pi, Qi, Ri generated from the row pre-decoder 160 are held in an inactive state regardless of the row address input RA. In other words, the memory cell block MCBi is not selected by a row address RA, but the memory cell block M/RCBi to be substituted for the MCBi will be selected according to the redundancy signal /RED1–/RED16.

In a non-volatile semiconductor memory device according to other embodiments of the invention, a memory cell array includes a plurality of memory cell blocks. Several blocks in the memory cell blocks may be assigned to normal memory cell blocks or they may be used as substitutes for defective memory cell blocks. For example, these memory blocks may be sequentially selected in a reverse order (i.e., from the highest address bit) in order to substitute for defective memory cell blocks. This means that there is no need for mapping an additional address for a user who employs a memory device having bad blocks for the first time. Moreover, among the memory blocks M/RCB1–M/RCB16, several blocks that have not yet been taken for substitution can also be available as normal memory blocks.

Figure 5:
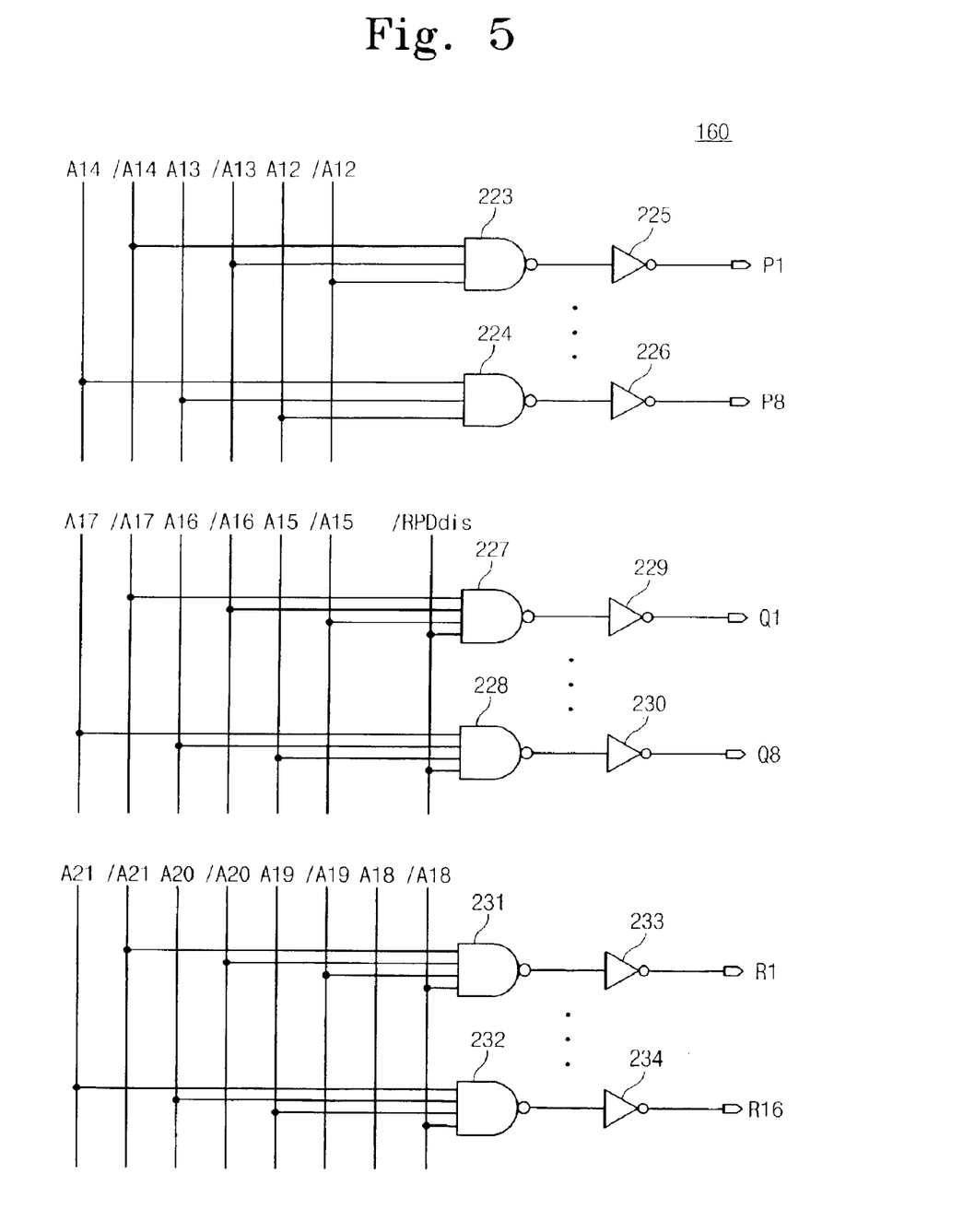
FIG. 5 further illustrates the row pre-decoder circuit shown in FIG. 2.

FIG. 5 is an exemplary embodiment of the row pre-decoder circuit 160 in FIG. 2. Referring to FIG. 5, row pre-decoder 160 is constructed of three decoding blocks. The first decoding block decodes row address signals A12, /A12, A13, /A13, A14, /A14 and generates decoding signals P1–P8 (P2–P7 not shown). The first decoding block includes eight NAND gates (223 and 224 are shown) and 8 inverters (225 and 226 are shown), each corresponding to one of the NAND gates. For input signals, each NAND gate is connected to three of the row address signals A12, /A12, A13, /A13, A14, /A14.

The second decoding block decodes row address signals A15, /A15, A16, /A16, A17, /A17 and generates decoding signals Q1–Q8 (Q2–Q7 not shown). The second decoding block includes eight NAND gates (227 and 228 are shown), eight inverters (229 and 230 are shown), each corresponding to one of the NAND gates. For input signals, each NAND gate is connected to three of the row address signals A15, /A15, A16, /A16, A17, /A17 and the disabling signal /RPDdis.

In such a circuit structure, decoding signals Q1–Q8 are selectively activated according to the row address signals when a disabling signal /RPDdis is at a high level, while all decoding signals are inactivated regardless of the row address signals when the disabling signal /RPDdis is set at a low level.

The third decoding block decodes row address signals A18, /A18, A19, /A19, A20, /A20, A21, /A21 and generates decoding signals R1–R16 (R2–R15 not shown). The third decoding block includes sixteen NAND gates (231 and 232 are shown) and sixteen inverters (233 and 234 are shown), each corresponding to one of the NAND gates. For input signals, each NAND gate is connected to four of the row address signals A18, /A18, A19, /A19, A20, /A20, A21, /A21.

Figure 6:
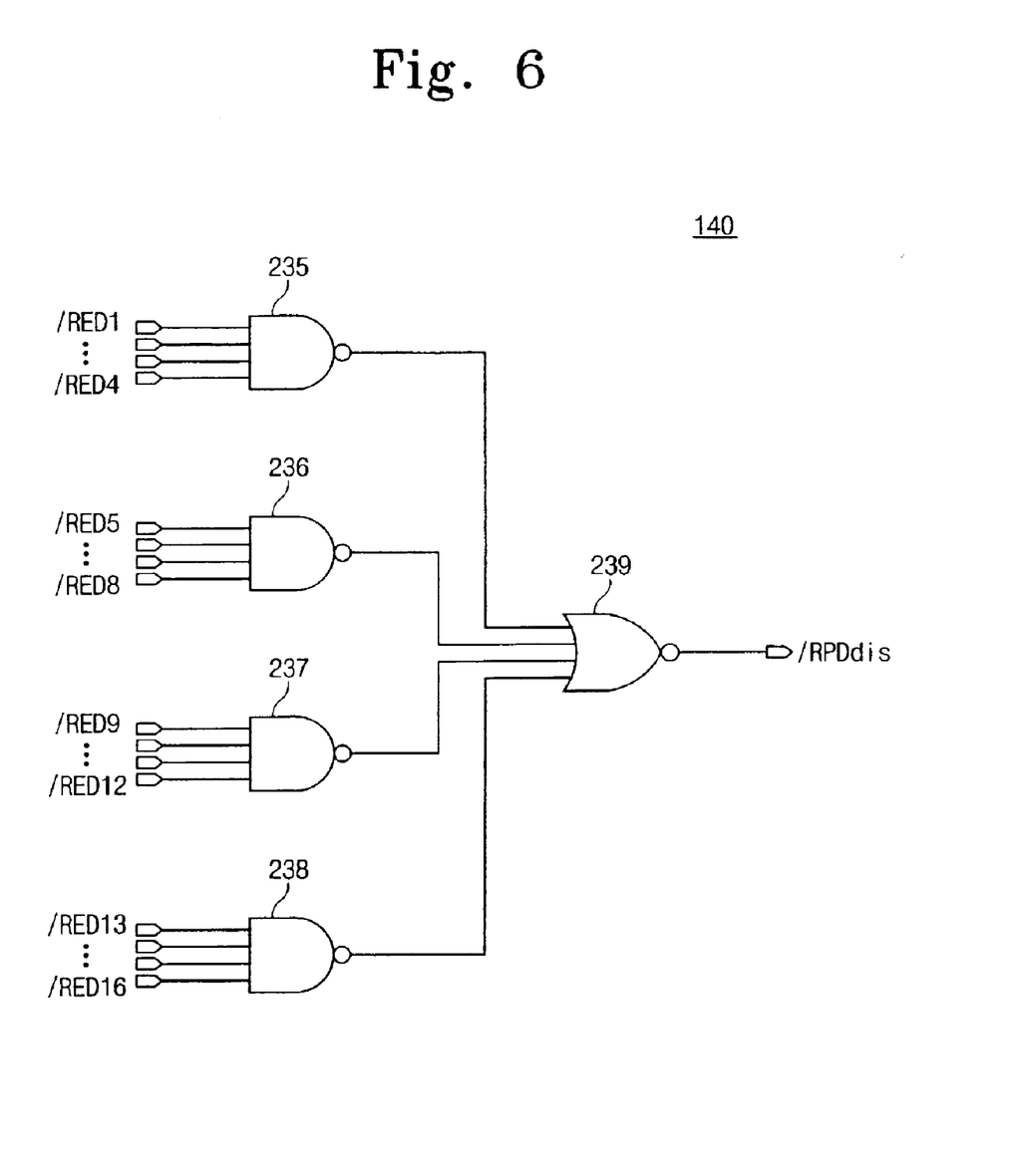
FIG. 6 further illustrates the disabling circuit shown in FIG. 2.

FIG. 6 is an exemplary embodiment of the disabling circuit 16 of FIG. 2. Referring to FIG. 6, the disabling circuit 140 is constructed of four NAND gates 235–238 and a NOR gate 239. The redundancy signals /RED1–/RED4 are applied to the NAND gate 235 while the redundancy signals /RED5–/RED8 are applied to the NAND gate 236. The redundancy signals /RED9–/RED12 are applied to the NAND gate 237 while the redundancy signals /RED13–/RED16 are applied to the NAND gate 238. Since at least one of the redundancy signals /RED1–/RED16 goes to low level, the disabling signal /RPDdis is set at a low level. As seen in FIG. 5, if the disabling signal /RPDdis is set low, then the decoding signals Q1–Q8 of the row pre-decoder 160 are set to a low level as well.

Figure 7:
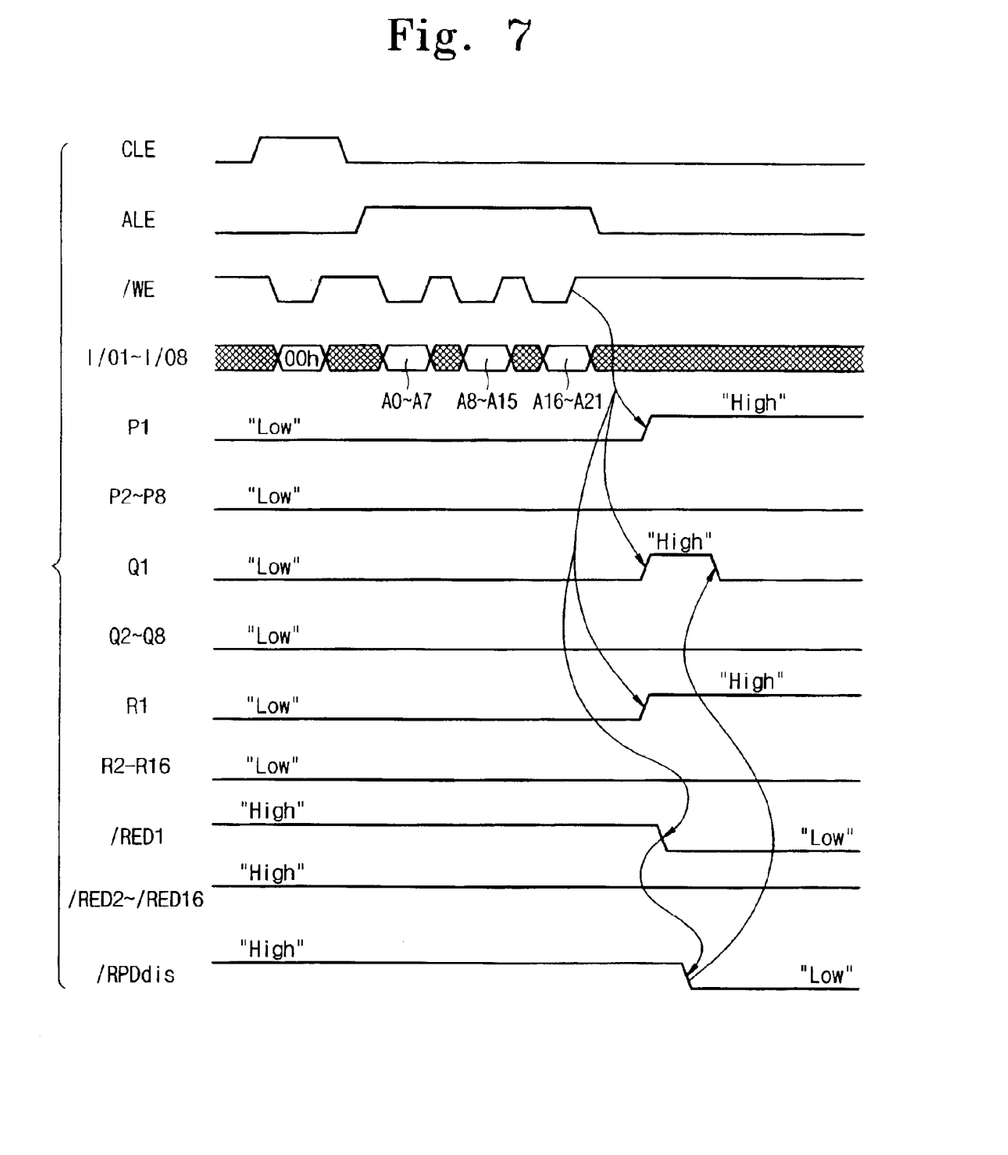
FIG. 7 is a timing diagram illustrating the bad block mapping operation of the non-volatile memory device of FIGS. 2–6.

FIG. 7 is a timing diagram illustrating a read operation in the non-volatile semiconductor device 100 according to embodiments of the invention. The device is implemented in a NAND flash memory device. The memory device is capable of electrically erasing and programming, in which read/write operations are operable with commands and addresses introduced from the external. The read operation of the non-volatile semiconductor memory device will now be explained as follows with reference to the drawings. For the purpose of a simple explanation, assuming that the memory cell block MCB1 is a defective memory cell block, it would be obvious to store row address information corresponding to the defective memory cell block at the address store circuit 120.

In order to conduct a read operation in the NAND flash memory device, as shown in FIG. 7, a read command "00h" is input to the memory deice through input/output pins I/O1–I/O8. After that, according to control signal /WE, address signals A0–A7, A8–A15, and A16–A21 are introduced into the memory device through the input/output pins I/O1–I/O8 during three consecutive cycle times. As discussed previously, the address signals A0–A7 are a column address and the address signals A8–A21 are a row address. If a current row address is an address designating the defective memory cell block MCB1, the NAND flash memory device selects the memory cell block M/RCB1 instead of MCB1. This process is outlined below.

After all the address signals A0–A21 are introduced, the row pre-decoder 160 decodes the row address signals A0–A21 and then generates the decoding signals Pi, Qi, Ri. Because the row address designates the memory cell block MCB1, referring to FIG. 7, only the decoding signals P1, Q1, R1 are enabled to high levels. At the same time, the address storage circuit 120 determines whether the row address A8–A21 is an address designating a defective memory cell block or not. Since the row address designates a defective memory cell block MCB1, the address storage circuit 120 drops the redundancy signal /RED1 to a low level.

The disabling signal /RPDdis drops to a low state, triggered by the low level redundancy signal /RED1. As a result, the decoding signal Q1 falls to a low level. As the decoding signal Q1 becomes low level, the decoding circuit RD1 associated with the memory cell block MCB1 is disabled. During this time, the high voltage switch 216 in the row decoder RD1 is not operational.

On the other hand, the row decoder RD1024 associated with the memory cell block M/RCB1 is enabled in response to the low-level redundancy signal /RED1, regardless of the decoding signals Pi, Qi, Ri. Specifically, the output signal of NAND gate 202 in the row decoder RD1024 is enabled in response to redundancy signal /RED1, without regard to the associated decoding signals Pi, Qi, Ri. This causes the high voltage circuit 205 operate. As a result, the memory cell block is selected as a redundant cell block.

A data sensing operation in the selected memory cell block is generally well known so the following detailed description is abbreviated. In embodiments of the invention, row address information indicating defective memory cell blocks of the memory cell array is stored in the address storage circuit 120.

During this time, the address information of a memory cell block to be substituted for a defective block is stacked in the address storage circuit 120 in sequential order, starting with the highest address, which causes the block with the highest address to be substituted for the first defective block. Using this method, a defective memory cell block is replaced with the designated memory cell block and therefore additional bad block information is not necessary to arrange information for the defective cell block.

In summary, the memory cell blocks are divided into first memory cell blocks and second memory cell blocks. The first memory cell blocks are substitutes for defective second memory cell blocks. A block selection circuit selects the first memory cell blocks when one or more defective memory cell blocks are present in the second memory cell blocks. The block selection circuit selects first memory cell blocks to substitute for the defective memory cell blocks starting with the first memory cell block with the highest address and proceeding in reverse order. Moreover, the first memory cell blocks that are not substituted for defective memory cell blocks may be used as normal memory cell blocks by means of the memory block selection circuit.

In accordance with embodiments of the invention, a semiconductor memory device includes first memory cell blocks and second memory cell blocks that store data information, a decoding signal generation circuit that generates decoding signals in order to select the first and second memory cell blocks after decoding a row address, and a first row decoder circuit for selecting the first memory cell block in response to the decoding signals and redundancy signals. The semiconductor memory device also includes a second row decoder circuit that selects the second memory cell blocks in response to the decoding signals, an address storage circuit that generates redundancy signals when the row address indicates that a second memory cell blocks is defective, and a disabling circuit that inactivates the decoding signal generation circuit in response to the activation of the redundancy signals.

When a row address indicates that a second memory cell block is a defective memory cell block, the second memory cell block is not selected by the inactivation of the decoding signal generation circuit, while a first memory cell block is selected through activation of the redundancy signals. If the second memory cell block is not a defective memory cell block, the second memory cell block is selected as a normal block in accordance with an input of row address.

In this implementation, the first row decoder circuit includes a first detection circuit that receives the decoding signals and generates a first output signal, a second detection circuit that receives the first output signal and the redundancy signals and generates a first high voltage generator enable signal, a first high voltage generator that receives the first high voltage generator enable signal and generates a first memory cell block selection signal, and a first switch block that receives the first memory cell block selection signal.

The second row decoder circuit includes a third detection circuit that receives the decoding signals and generates a second output signal, a fourth detection circuit that receives the second output signal and generates a second high voltage generator enable signal, a second high voltage generator that receives the second high voltage generator enable signal and generates the second memory cell block selection signal, and a second switch block that receives the second block selection signal.

In accordance with other embodiments of the invention, a NAND flash memory device includes a memory cell array having first memory cell blocks and second memory cell blocks, a decoding signal generation circuit that generates decoding signals that select the first and second memory cell block after decoding a row address, a first row decoder for selecting one of the first memory cell blocks in response to the decoding signals and a redundancy signal, a second row decoder that selects one of the second memory cell blocks in response to the decoding signals, an address store circuit that activates one of the redundancy signals when the row address indicates that the first memory cell block is a defective memory cell block, and a disabling circuit that inactivates the decoding signal generation circuit in response to the activation of the redundancy signal.

When a first memory cell block is substituted for the defective memory cell block, the first memory cell block is selected from the highest address in reverse order, and other non-substitute first memory cell blocks are used as normal memory cell blocks. When the row address indicates that at least one second memory cell block is defective, the defective memory cell block is not selected because the decoding signal generation circuit is inactivated. Instead, the corresponding first memory cell block is selected through the activation of the redundancy signal. The address store circuit generates the redundancy signal to select the first memory cell blocks, beginning with the first memory cell block with the highest address and proceeding in reverse order.

As a result, a user can serially use a non-defective memory cell block corresponding to the row address as well as exclude a defective cell block from the lowest address without additional address mapping. As described above, although embodiments of the invention were disclosed for illustrative purposes, those skilled in the art will appreciate that various modifications, additions and substitutions are possible, without departing from the scope and spirit of the invention. For example, an exclusive redundant block is provided in the memory cell array and may be used by way of well known redundancy method. The invention should be limited only by the accompanying claims.

What is claimed is:

1. A non volatile memory device comprising:
   an array including a plurality of memory cell blocks;
   a plurality of first memory cell blocks having a first plurality of memory cells;
   a plurality of second memory cell blocks having a second plurality of memory cells and including a first number of defective memory cell blocks; and
   a block selection circuit that substitutes a second number of first memory cell blocks for the first number of defective memory cell blocks, wherein the block selection circuit substitutes the second number of first memory cell blocks in reverse order beginning with the highest address, and wherein the first number of defective memory cell blocks is equal to the second number of first memory cell blocks.

2. The device of claim 1, wherein the non-volatile memory device is a NAND-type flash memory device.

3. The device of claim 1, wherein with the exception of the second number of first memory cell blocks, the plurality of first memory cell blocks are used in the same fashion as the plurality of second memory cell blocks.

4. The device of claim 1, wherein the block selection circuit stores address information for the first number defective memory cell blocks.

5. The device of claim 4, wherein the block selection circuit generates a redundancy signal.

6. The device of claim 5, further comprising a disabling circuit that receives the redundancy signal and generates a disabling signal.

7. A non-volatile memory device having a plurality of memory cell blocks comprising:
- a first memory cell block that stores first data;
- a second memory cell block that stores second data;
- a decoding signal generation circuit that generates decoding signals that selects between the first memory cell block and the second memory cell block according to row address;
- an address store circuit that generates a redundancy signal in response to the row address;
- a first row decoder circuit that selects the first memory cell block in response to the decoding signals and the redundancy signal;
- a second row decoder circuit that selects the second memory cell block in response to the decoding signals; and
- a disabling circuit that generates a disabling signal in response to the redundancy signal, wherein when the row address indicates that the first memory cell block is a defective memory cell block, the disabling circuit generates the disabling signal that activates the second memory cell block and inactivates the first memory cell block.

8. The device of claim 7, wherein the memory device is a NAND-type flash memory.

9. The device of claim 7, wherein the first row decoder circuit further comprises:
- a first detection circuit that receives the decoding signals and generates a first output signal;
- a second detection circuit that receives the first output signal and the redundancy signal and generates a first high voltage generator enable signal;
- a first high voltage generator that receives the first high voltage generator enable signal and generates a first memory cell block selection signal; and
- a first switch block that receives the first memory cell block selection signal.

10. The device of claim 7, wherein the second row decoder circuit further comprises:
- a third detection circuit that receives the decoding signals and generates a second output signal;
- a fourth detection circuit that receives the second output signal and generates a second high voltage generator enable signal;
- a second high voltage generator that receives the second high voltage generator enable signal and generates the second memory cell block selection signal; and
- a second switch block that receives the second memory cell block selection signal.

11. A non volatile memory device comprising:
- an array comprising a plurality of first memory cell blocks and a plurality of second memory cell blocks;
- an address store circuit that generates redundancy signals in response to row addresses;
- a disabling circuit that generates disabling signals in response to the redundancy signals;
- a row pre-decoder circuit that generates decoding signals that select between the plurality of first memory cell blocks and the plurality of second memory cell blocks according to the row addresses;
- a plurality of first row decoders that select one of the plurality of first memory cell blocks in response to the decoding signals and the redundancy signals; and
- a plurality of second row decoders that select one of the plurality of second memory cell blocks in response to the decoding signals, wherein a first number of the plurality of first memory cell blocks are substituted for a second number of defective memory cell blocks in the plurality of second memory cell blocks in reverse order, beginning with the first memory cell block with the highest address.

12. The device of claim 11, wherein the plurality of first memory cell blocks that are not substituted for the second number of defective memory cell blocks are used in the same manner as the plurality of second memory cell blocks.

13. The device of claim 11, wherein the redundancy signals select the first memory cell blocks in reverse order, beginning with the first memory cell with the highest address.

14. The device of claim 11, wherein each of the first row decoders corresponds to one of the plurality of first memory cell blocks.

15. The device of claim 14, wherein the each of the first row decoders comprises:
- a first detection circuit that receives the decoding signals and generates a first output signal;
- a second detection circuit that receives the first output signal and the redundancy signals and generates a first high voltage generator enable signal;
- a first high voltage generator that receives the first high voltage generator enable signal and generates a first memory cell block selection signal; and
- a first switch block that receives the first memory cell block selection signal.

16. The device of claim 11, wherein each of the second row decoders corresponds to one of the plurality of second memory cell blocks.

17. The device of claim 16, wherein the each of the second row decoders comprises:
- a third detection circuit that receives the decoding signals and generates a second output signal;
- a fourth detection circuit that receives the second output signal and generates a second high voltage generator enable signal;
- a second high voltage generator that receives the second high voltage generator enable signal and generates the second memory cell block selection signal; and
- a second switch block that receives the second block selection signal.

* * * * *